United States Patent
He et al.

(10) Patent No.: US 12,430,246 B2
(45) Date of Patent: Sep. 30, 2025

(54) OUT-OF-ORDER PROGRAMMING OF FIRST WORDLINE IN A PHYSICAL UNIT OF A MEMORY DEVICE

(71) Applicant: Micron Technology, Inc., Boise, ID (US)

(72) Inventors: Deping He, Boise, ID (US); Ching-Huang Lu, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 18/203,223

(22) Filed: May 30, 2023

(65) Prior Publication Data

US 2023/0418742 A1    Dec. 28, 2023

Related U.S. Application Data

(60) Provisional application No. 63/355,512, filed on Jun. 24, 2022.

(51) Int. Cl.
*G11C 16/10* (2006.01)
*G06F 12/02* (2006.01)
*G11C 16/04* (2006.01)

(52) U.S. Cl.
CPC ...... *G06F 12/0292* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 2016/0322108 A1* | 11/2016 | Yang | G11C 16/10 |
| 2017/0139626 A1* | 5/2017 | Wakchaure | G06F 3/0625 |
| 2019/0129629 A1* | 5/2019 | Lin | G06F 3/0619 |

* cited by examiner

*Primary Examiner* — Khamdan N. Alrobaie
(74) *Attorney, Agent, or Firm* — Lowenstein Sandler LLP

(57) ABSTRACT

A memory device includes a memory array comprising memory cells associated with a plurality of wordlines control logic that is to perform operations including: causing memory cells of a physical unit of the memory array to be programmed starting at a second wordline, which is adjacent to a first wordline of the memory array, and proceeding sequentially through a plurality of sequentially-ordered wordlines of the physical unit, wherein the first wordline is associated with memory cells that are adjacent to one or more select gate (SG) transistors of the memory array, and the sequentially-ordered wordlines are numbered according to a distance away from the one or more SG transistors; and at least one of after the memory cells associated with the second wordline are programmed or after completion of programming the physical unit, causing the memory cells associated with the first wordline to be programmed.

20 Claims, 10 Drawing Sheets

FIG. 4

OUT-OF-ORDER PROGRAMMING OF FIRST WORDLINE IN A PHYSICAL UNIT OF A MEMORY DEVICE

REFERENCE TO RELATED APPLICATION

This application claims the benefit of U.S. Provisional Patent Application No. 63/355,512, filed Jun. 24, 2022, the entirety of which is incorporated herein by reference.

TECHNICAL FIELD

Embodiments of the disclosure relate generally to memory sub-systems, and more specifically, relate to out-of-order programming of first wordline in a physical unit of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 is a graphical representation of out-of-order programming of memory cells associated with a first wordline of the sequentially-ordered wordlines in accordance with some embodiments of the present disclosure.

DETAILED DESCRIPTION

Figure 1A:
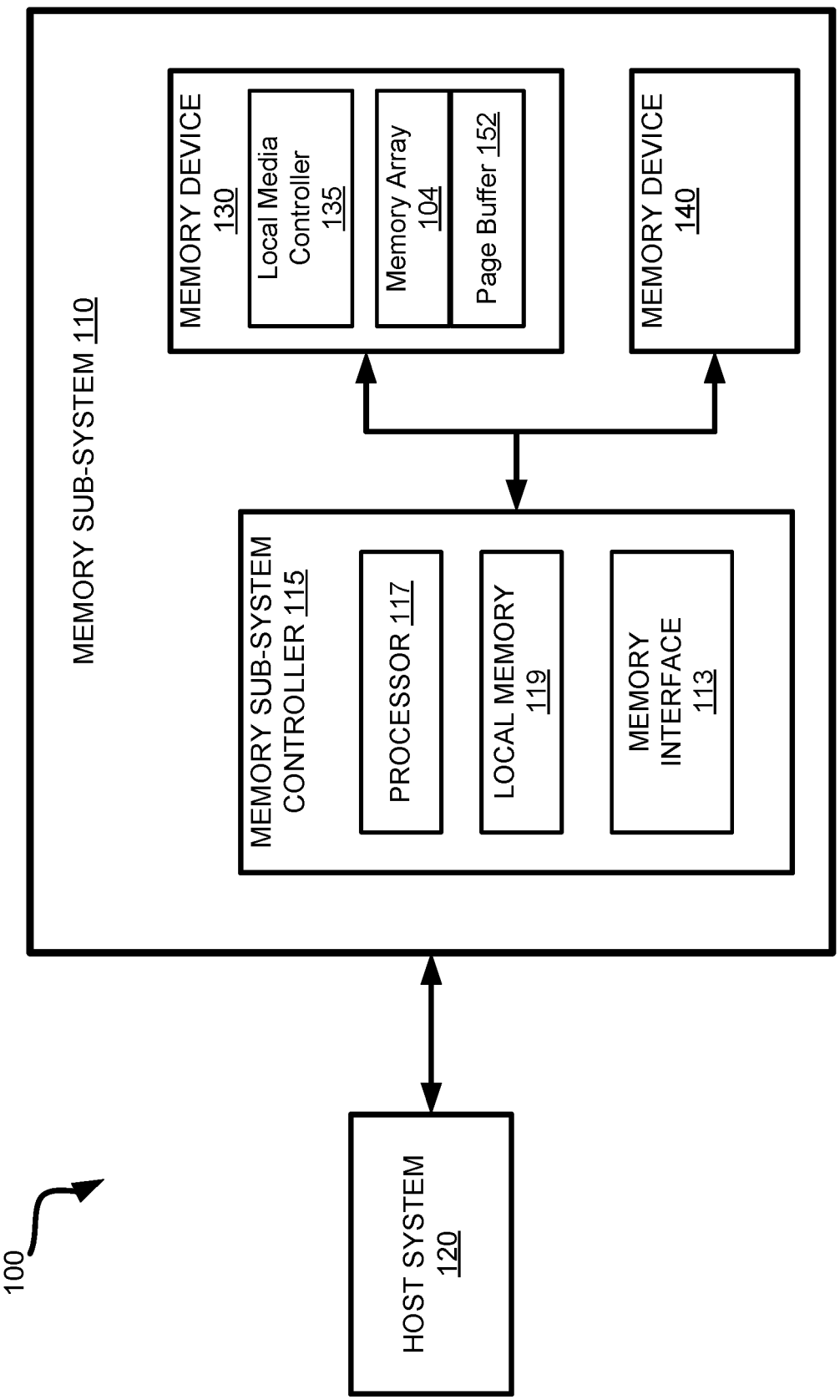
FIG. 1A illustrates an example computing system that includes a memory sub-system in accordance with some embodiments of the present disclosure.

Embodiments of the present disclosure are directed to out-of-order programming of a first wordline in a physical unit of a memory device. One or more memory devices can be a part of a memory sub-system, which can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can include two or more planes. For some types of non-volatile memory devices (e.g., NAND devices), each plane includes of a set of physical units, e.g., physical blocks in some embodiments. In some implementations, each block can include multiple physical units, e.g., physical sub-blocks. Each plane carries a matrix of memory cells formed onto a silicon wafer and joined by conductors referred to as wordlines and bitlines, such that a wordline joins multiple memory cells forming a row of the matrix of memory cells, while a bitline joins multiple memory cells forming a column of the matrix of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

In certain memory devices, control logic (such as in a local media controller of the NAND) causes memory cells of each physical unit of memory (such as each physical sub-block) to be programmed, where the memory cells are associated with sequentially-ordered wordlines. More specifically, the control logic directs programming so that memory cells associated with a first wordline (WL0) are programmed first, memory cells associated with a second wordline (WL1) are programmed second, and so forth sequentially causing programming to memory cells of subsequently-ordered (or numbered) wordlines, WL2, ... WN, for example. The programming is typically of user data as programming is managed for the host system.

In these memory devices, a memory sub-system controller and/or the control logic also stores metadata to a physical-to-logical (P2L) mapping data structure, where the metadata contains mappings between physical addresses to logical addresses (e.g., logical block addresses) of the host data, which is to be used later to retrieve the data in response to read commands. This architecture is referred to as a flash translation layer (FTL) that store such mappings. While a P2L mapping data structure, such as a P2L mapping table, is referred to herein, it should be understood that there may be more than one mapping data structure, such as to trace hierarchy of the NAND from dice, to planes, to blocks, to sub-blocks, to pages, and the like. Thus, when the P2L mapping data structure is referred to herein, reference to multiple P2L mutually-indexed mapping tables or the like may be implied.

In such memory devices, the P2L mapping data structure is typically stored in local volatile memory of a memory sub-system controller and/or of the memory device, e.g., in static random-access memory (SRAM), tightly-coupled memory (TCM), and/or dynamic random-access memory (DRAM). Storing the P2L mapping data structure in volatile memory enables quick access for performance purposes, but involves a number of disadvantages, including requiring an ever-increasing amount of costly volatile memory as memory devices increase in size, requires separate handling and updating to track staleness for media management (e.g., garbage collection), and requires complicated and costly handling in the event of a power loss. As to the media management, when data is moved or erased, the P2L mapping data structure has to be updated as well, requiring additional reads and writes to the volatile memory. As to power-loss handling, the memory device requires complicated power-loss algorithms and can require additional hardware, such as capacitors, used to retain the P2L mapping data structure long enough to be flushed to a block on the memory device (e.g., on the NAND). The flush is required in order to retain the P2L mapping data structure and be able to thus retrieve the data from the correct locations on the NAND memory device after power up.

Aspects of the present disclosure address the above and other deficiencies by facilitating out-of-order programming (where memory cells of a first wordline are not programmed first), which in turn can eliminate the need for a global P2L mapping data structure for the memory device that is stored in volatile memory. For example, control logic of the memory device can instead store and update a separate P2L mapping data structure for each physical unit of memory (e.g., block or sub-block) within that physical unit.

In some embodiments, the control logic can cause memory cells of a physical unit of a memory array to be programmed starting at a second wordline, which is adjacent to the first wordline, and proceed sequentially through sequentially-ordered wordlines of the physical unit, where the first wordline is associated with memory cells that are adjacent to one or more select gate (SG) transistors of the memory array, and the sequentially-ordered wordlines are numbered (for purposes of sequential ordering) according to a distance away from the one or more SG transistors. The SG transistors can be turned on and off in order to selectively connect a string of memory cells of the memory array to a bitline or a common source (SRC) line. Further, while the physical unit is being programmed or after completion of programming the physical unit, the control logic may cause the memory cells associated with the first wordline (WL0) to be programmed, thus enabling out-of-order programming of the memory cells associated with the first wordline, e.g., not being programmed first before other memory cells associated with the second wordline through the final wordline of the sequentially-ordered wordlines.

In at least some embodiments, causing the memory cells associated with the first wordline to be programmed includes causing a mapping to be programmed to the memory cells associated with the first wordline. The mapping can be of physical addresses to logical addresses of user data programmed to the physical unit, e.g., to include the P2L mapping data structure.

Advantages of this approach include, but are not limited to, retaining the advantages while eliminating the disadvantages of storing a P2L mapping data structure in volatile memory. In various embodiments, because the first wordline is configured as SLC memory and the P2L mapping is stored in a fixed location, memory cells of the first wordline can be programmed quickly (akin to cache), thus is comparable to the speed of storing the P2L mapping data structure in volatile memory. Further, because the P2L mapping data structure is physically stored in the physical unit to which the P2L mapping data structure is associated, there is no separate action needed for media management. Specifically, while the P2L mapping data structure is updated at different optional times while programming a respective physical unit of memory, when the physical unit of memory is erased, the P2L mapping data structure can likewise be erased during a media management operation. Additionally, because the P2L mapping data structure is stored in the non-volatile memory (NVM) of the memory array, there is no requirement to flush the P2L mapping data structure to NVM in response to a power loss. Even updates that were pending upon power loss can be made to the P2L mapping data structure after power up based on any pages that finished being programmed before the power loss. Additional advantages would be apparent to one skilled in the art in possession of the following disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

The memory device 130 can be made up of bits arranged in a two-dimensional or three-dimensional grid, also referred to as a memory array. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device. Memory device 130, for example, can represent a single die or multiple dice having some control logic (e.g., local media controller 135) embodied thereon. In some embodiments, one or more components of the memory sub-system 110 are omitted.

In one embodiment, the memory sub-system 110 includes a memory interface component 113. The memory interface component 113 is responsible for handling interactions of the memory sub-system controller 115 with the memory devices of the memory sub-system 110, such as the memory device 130. For example, the memory interface component 113 can send memory access commands corresponding to requests received from the host system 120 to the memory device 130, such as program commands, read commands, or other commands. In addition, the memory interface component 113 can receive data from the memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in the local memory 119 for performing the operations described herein. In some embodiments, the memory interface component 113 is part of the host system 120, an application, or an operating system.

In some embodiments, memory device 130 includes the local media controller 135, a memory array 104, and a page buffer 152 coupled with the memory array 104. The local media controller 135, which can be operatively coupled to the memory array 104 and is also referred to as control logic herein, can direct the order in which wordlines are programmed, e.g., to program and update any P2L mapping to a first wordline (WL0) after having programmed sequentially-ordered wordlines (e.g., WL1 . . . WLN) beyond the first wordline (WL0). The P2L mapping, for example, can be a physical-to-logical mapping data structure or other P2L mapping.

In some embodiments, the page buffer 152 provides the circuitry used to program data to the memory cells of the memory device 130 and to read the data out of the memory cells. This circuitry includes, for example, a number of latches for buffering data. In some embodiments, this control logic is integrated in whole or in part within the memory sub-system controller 115 and/or the host system 120. Further details with regards to the operations of local media controller 135 are described below.

Figure 1B:
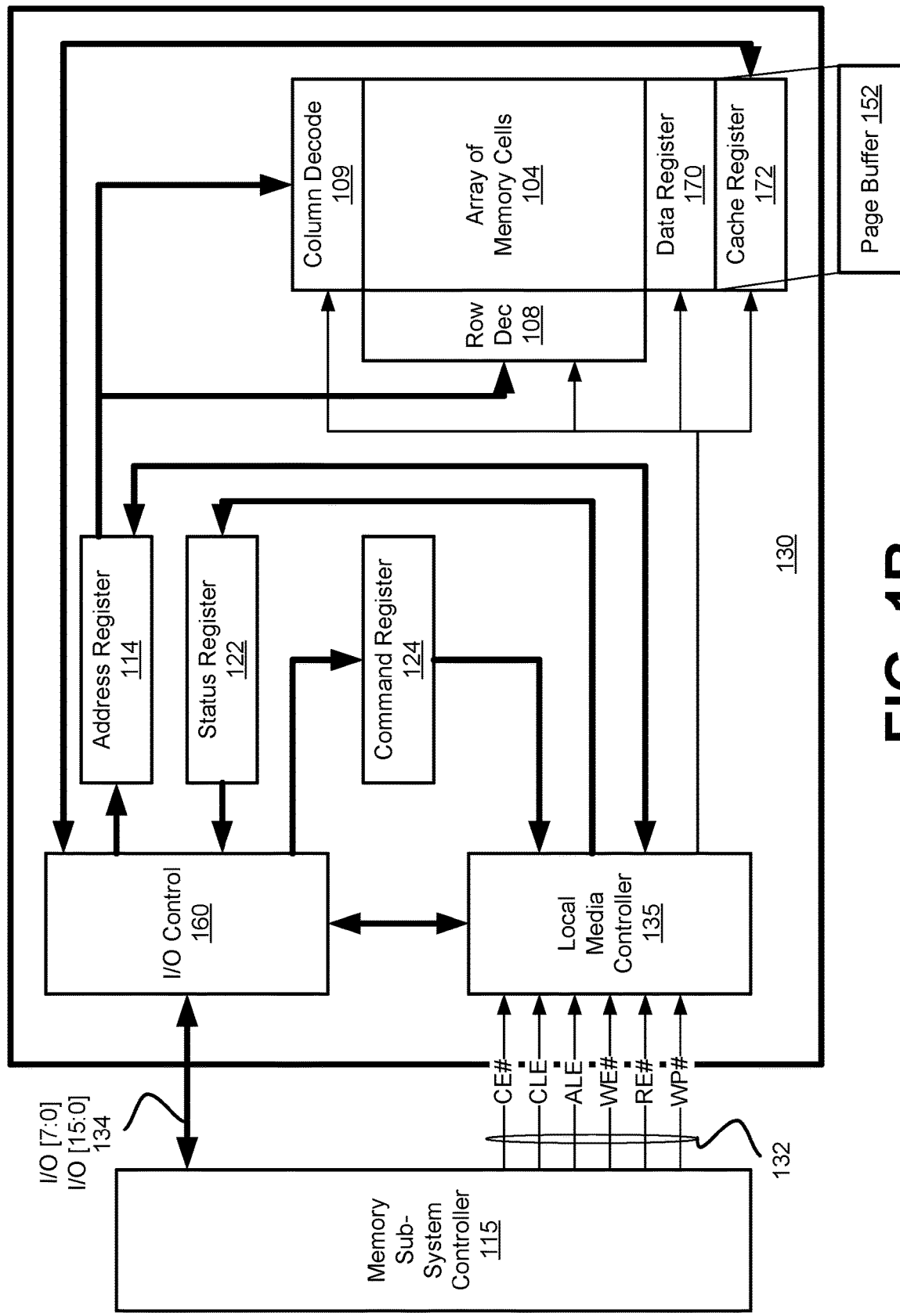
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 can perform a ganged SLC verify operation to concurrently verify (i.e., at least partially overlapping in time) that memory cells in two separate sub-blocks of a block of memory array 104 were successfully programed with data from two separate pages using a single sensing operation.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) the page buffer 152 of the memory device 130. The page buffer 152 may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
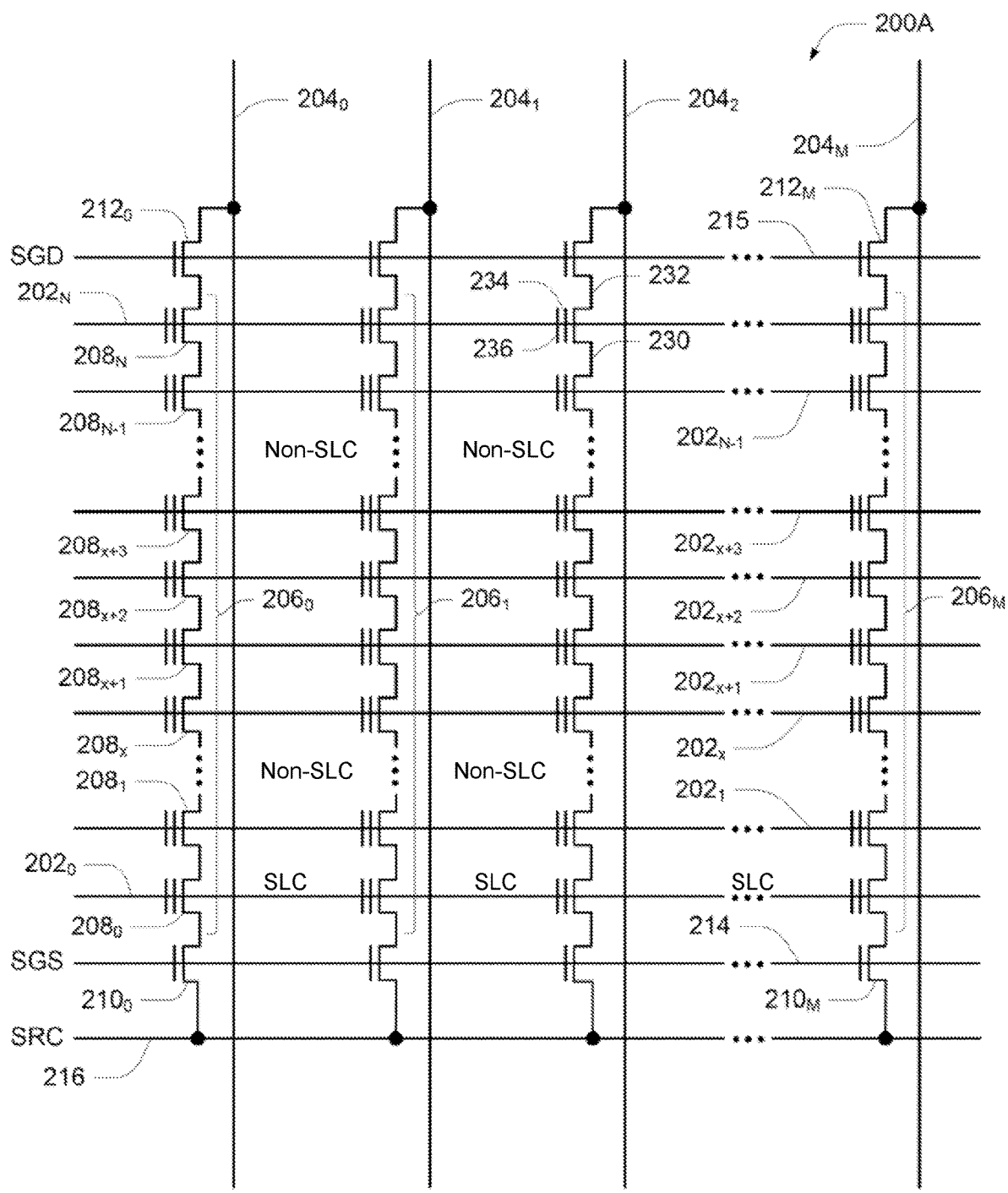
FIGS. 2A-2C are schematics of portions of an array of memory cells as could be used in a memory of the type described with reference to FIG. 1B according to an embodiment.
Figure 2B:
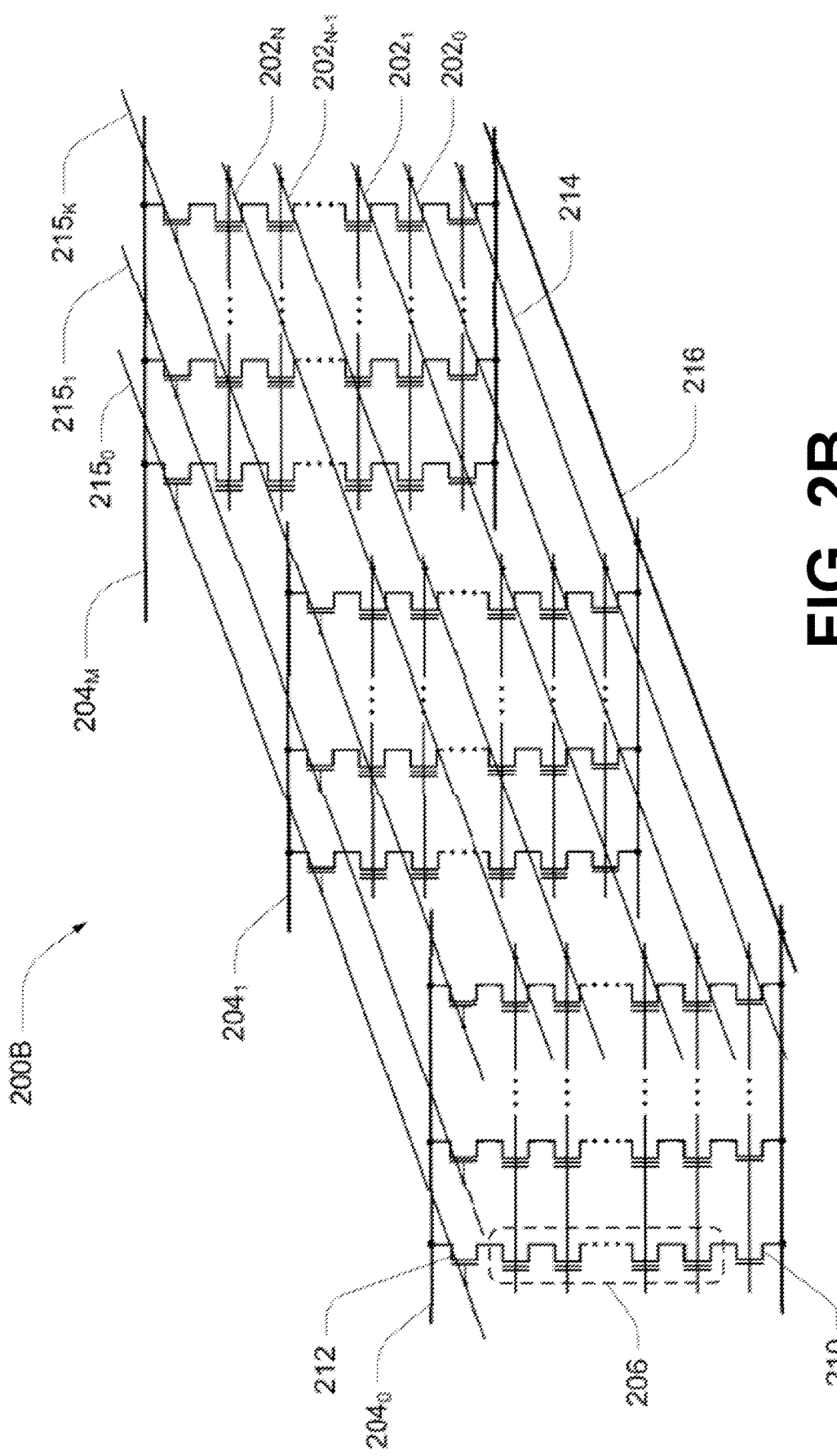
Figure 2C:
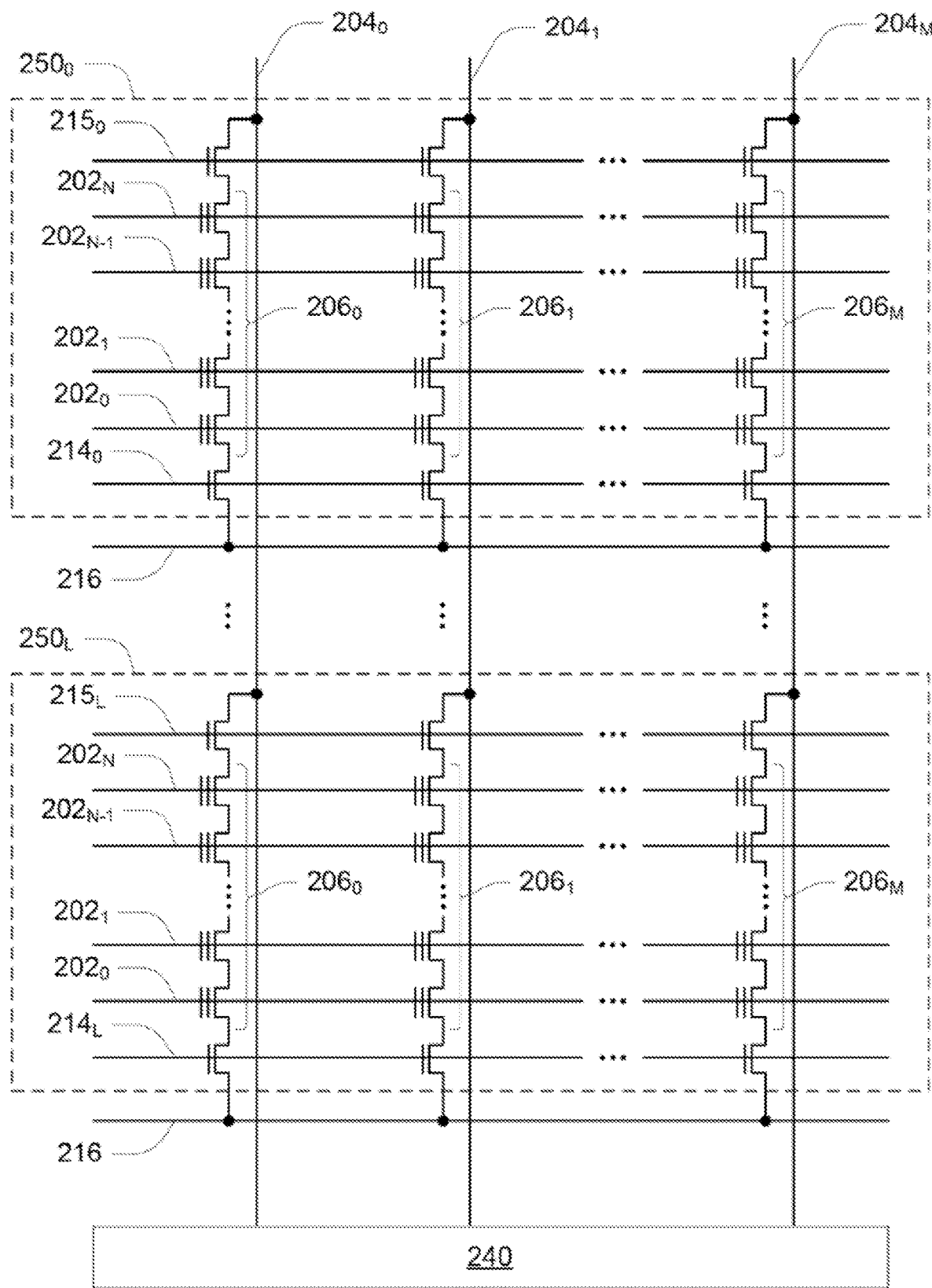

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well. In some embodiments, the memory array 200A is arranged with physical blocks, including physical sub-blocks (or other physical units) of memory cells.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$.

Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

In some embodiments, the drain select line (SGD) and source select line (SGS) are separated and biased to different sources or to a commonly shared source. Further, the SGD and SGS lines can be ones of several layers of memory sub-blocks, each layer that can include various connections as explained above. Further, the common source 216 (SRC) can be a plate that can be fully or partially segmented or may be full connected.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

In various embodiments, the memory cells associated with the first wordline $202_0$ can be configured as single-level cell memory (illustrated as "SLC" in FIG. 2A). Further, in these embodiments, all the memory cells, but the memory cells associated with the first wordline, of a physical unit of memory are configured as one of triple-level cell memory, multi-level cell memory, or quadruple-level cell memory (illustrated as "non-SLC" in FIG. 2A). In this way, the memory cells associated with the first wordline $202_0$ can be programmed faster than the memory cells associated with the other wordlines $202_1 \ldots 202_N$ of the physical unit and be used for out-of-order programming, as will be discussed in more detail.

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG.

2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. In some embodiments, each sub-block or string of memory cells has a separate select line 214 from other sub-blocks or strings. In some embodiments, a pair of sub-blocks shares a select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 3:
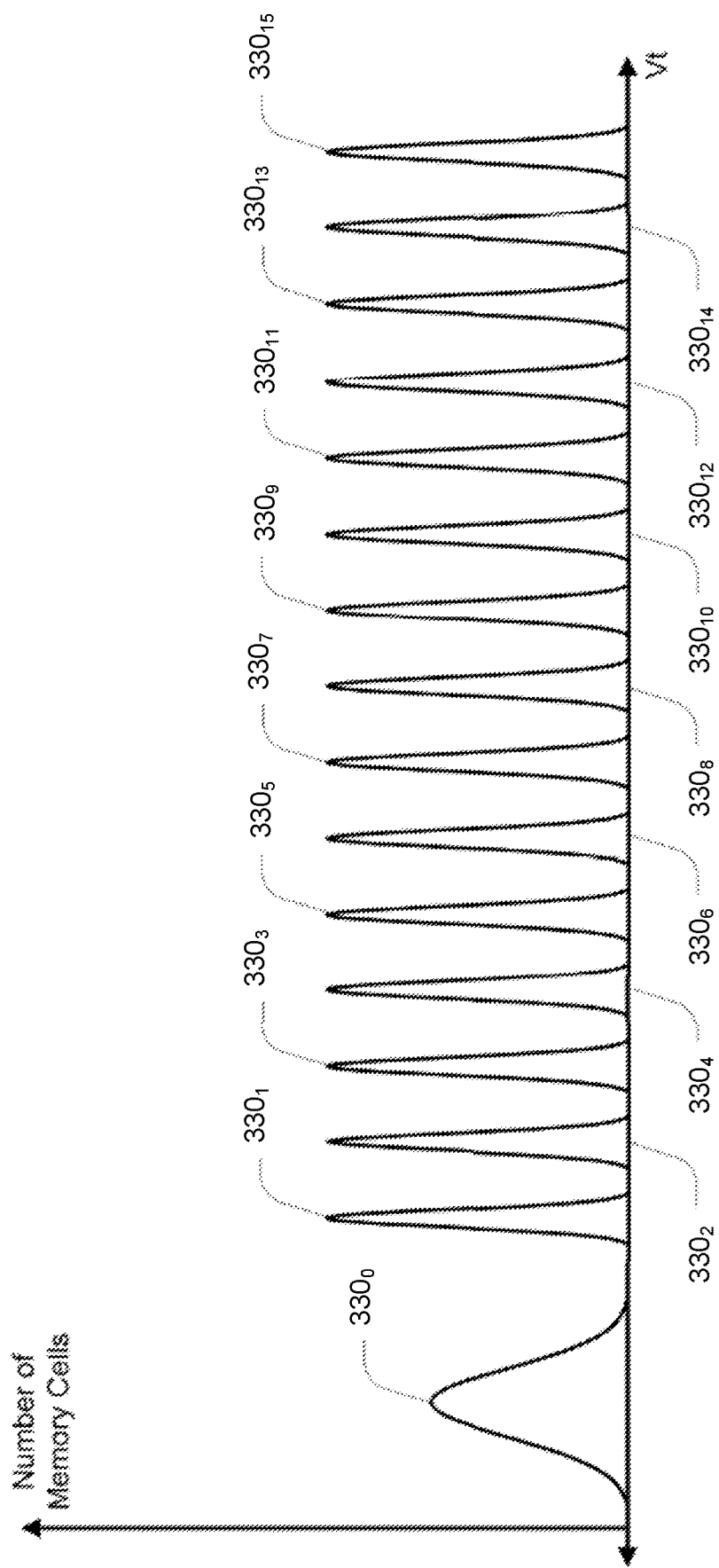
FIG. 3 is a conceptual depiction of threshold voltage distributions of multiple memory cells of a memory array according to an embodiment.

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

Figure 4:
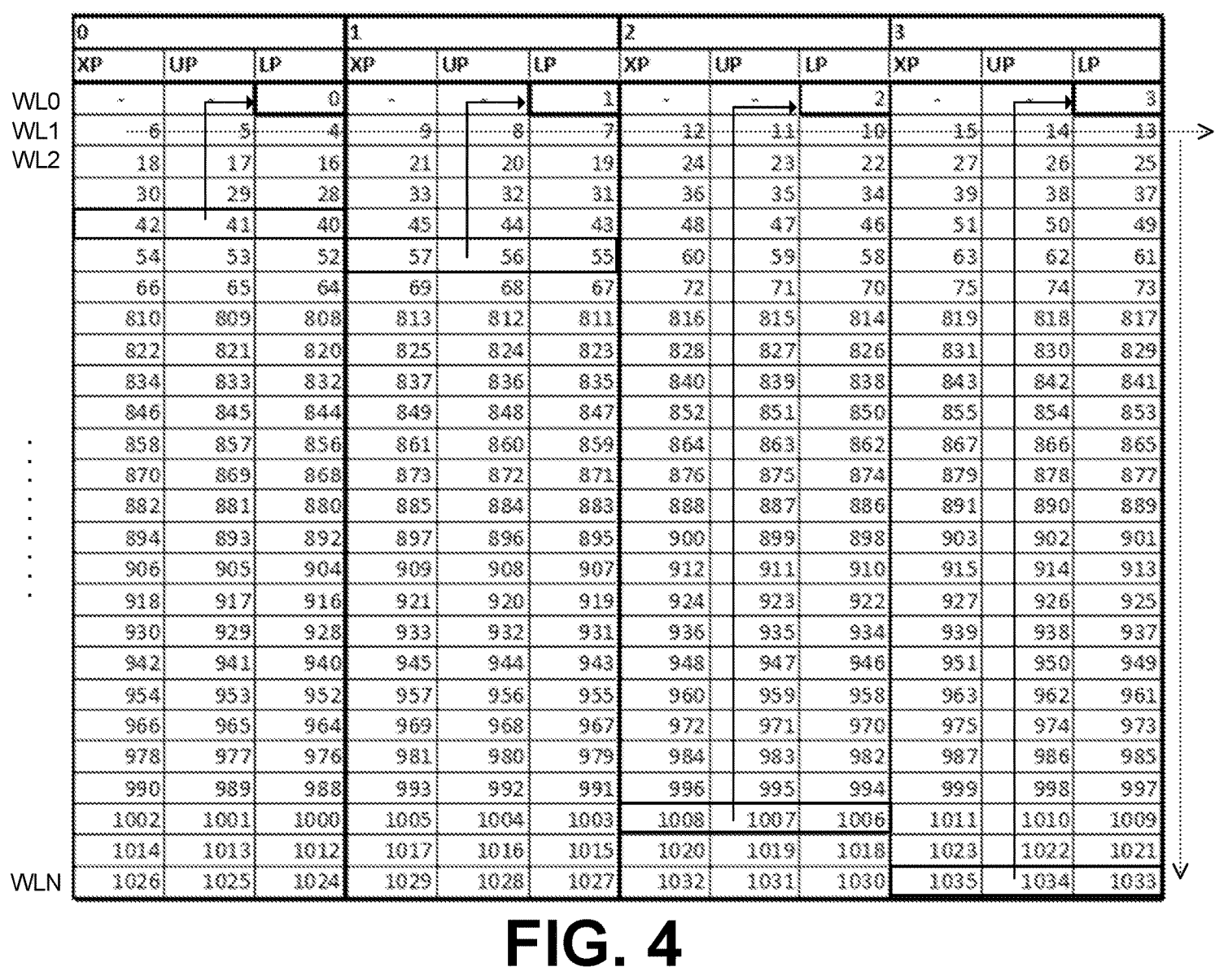

FIG. 4 is a graphical representation of out-of-order programming of memory cells associated with a first wordline of the sequentially-ordered wordlines in accordance with some embodiments of the present disclosure. Just for purposes of explanation, the physical units of memory illustrated include four sub-blocks numbered 0, 1, 2, and 3, which make up a physical block of memory, but in other embodiments, these can be physical units of different granularity. For memory cells configured as QLC memory, the XP, UP, and LP pages are illustrated as sub-columns of each sub-block of physical unit.

The typical way of programming physical units of memory is to sequentially program host data to memory cells associated with each wordline, starting from the first wordline (WL0), to a second wordline (WL1), or a third wordline (WL2), and so forth to the last wordline (WLN) of each physical unit (e.g., sub-block of memory cells). This inflexible approach excludes the possibility of out-of-order programming of wordlines, to include going back to program the memory cells associated with the first wordline (WL0) after others besides the first wordline have been programmed, e.g., to program or update the P2L mapping data structure. As illustrated, the memory cells associated with the first wordline (WL0) are configured as SLC memory while the remainder of the memory cells associated with wordline lines of each physical unit that are other-than-the-first wordline can be configured as QLC memory, although other types of multi-cell memory is envisioned and the present graphical representation is for exemplary purposes only.

To resolve the deficiencies previously identified, sequential programming may be performed starting with memory cells associated with the second wordline (WL1) and progressing to the third wordline (WL2) and so forth, for each physical unit (e.g. sub-block). This sequential programming of wordlines can continue until, at some point during or after completion of programming a given physical unit, returning to program the first wordline (WL0), e.g., the P2L mapping data structure for the physical unit. As discussed, the second wordline (WL1) can be located adjacent to the first wordline (WL0). The first wordline can be associated with memory cells that are adjacent to one or more select gate (SG) transistors of the memory array, e.g., the source select transistors 210 or the drain select transistors 212 of the memory array 200A (FIG. 2A). While the first wordline $202_0$ in FIG. 2A is illustrated as associated with memory cells that are adjacent to the source select transistors 210, in other embodiments, the first wordline $202_0$ is associated with memory cells that are adjacent to the drain select transistors 212.

In either programming approach, programming can proceed by turning on corresponding ones of the source select transistors 210 and the drain select transistors 212 to connect a corresponding sub-block or string of memory cells to the page buffer 152 that will apply a voltage to one of the bitline (e.g., $204_0$, $204_1$, . . . ) or the common source line 216 (or a separate source line in other architectures). A selected, consecutive wordline (also referred to as an access line) is then conducted (e.g., with one or more programming pulses) to a sufficient current in order to turn on a correspondingly-selected memory cell that is being programmed to a certain target programming voltage.

To illustrate just a few examples of out-of-order programming, the first physical unit is programmed up to page 42 followed by programming the memory cells associated with the first wordline (WL0), followed by continuing to program the first physical unit from page 52. Further, the second physical unit is programmed until page 57, followed by programming the memory cells associated with the first wordline (WL0), followed by continuing to program the second physical unit from page 67. Additionally, the third physical unit is programmed up to page 1008 followed by programing the memory cells associated with the first wordline (WL0), followed by continuing to program the third physical unit from page 1018. Further, the fourth physical unit is completely programmed through page 1035, followed by programming the memory cells the first wordline (WL0). In this latter example, by skipping or foregoing updates to the P2L mapping, the memory device 130 can experience a boost in benchmark write performance compared to writes that involve P2L mapping updates. Each time the memory cells associated with the first wordline (WL0) are programmed, it can be the P2L mapping data structure that is being programmed or updated from a previous programming, for example, or other memory operations that impact the P2L mapping.

Figure 5:
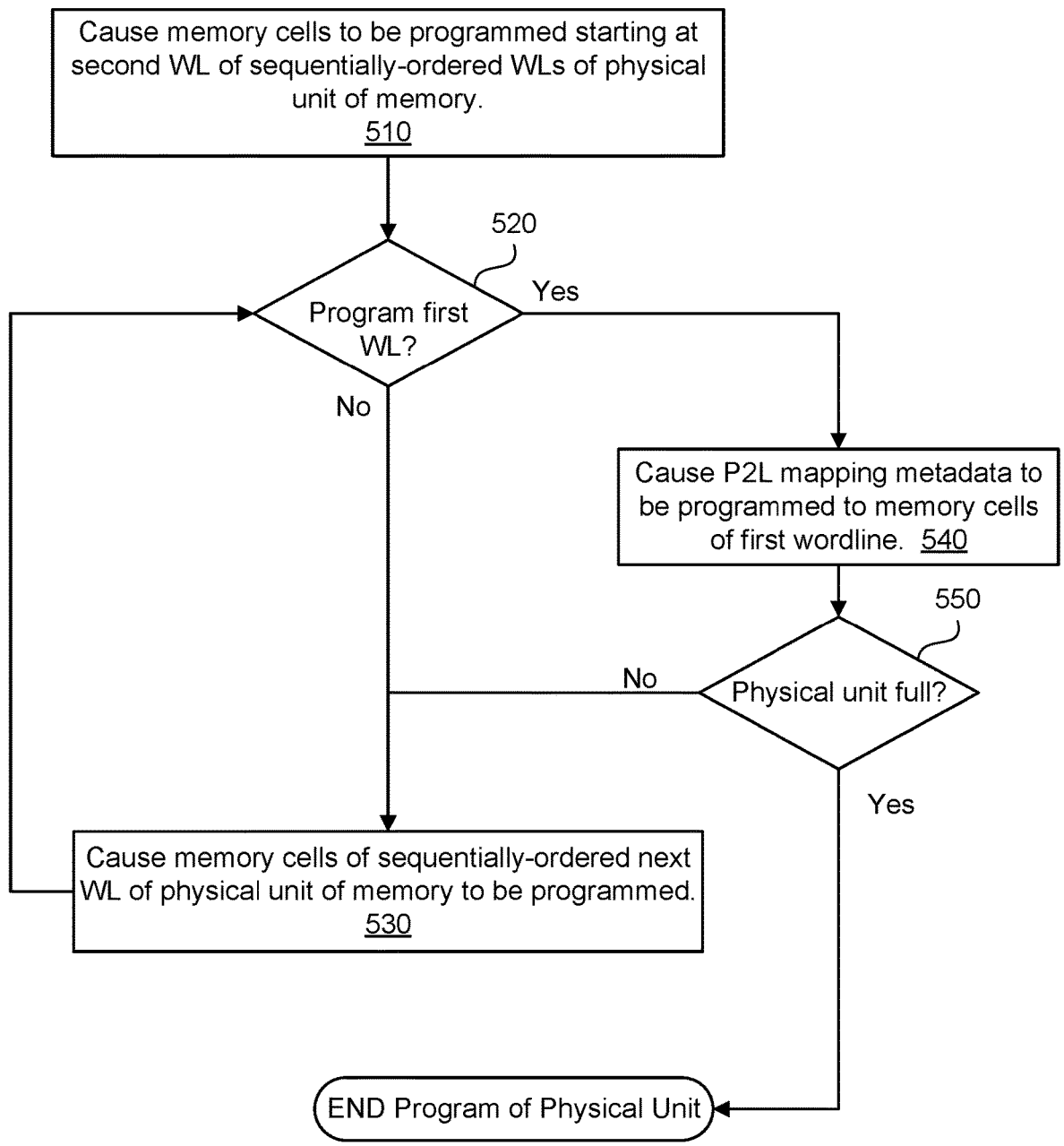
FIG. 5 is a flow diagram of an example method of out-of-order programming of memory cells associated with the first wordline of sequentially-ordered wordlines of a physical unit of memory in accordance with at least some embodiments.

FIG. 5 is a flow diagram of an example method 500 of out-of-order programming of memory cells associated with the first wordline of sequentially-ordered wordlines of a physical unit of memory in accordance with at least some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, memory cells of a physical unit of memory are programmed. More specifically, the processing logic causes memory cells of the physical unit of a memory array to be programmed starting at a second wordline of sequentially-ordered wordlines of the physical unit. In at least some embodiments, the second wordline (WL1) is located adjacent to the first wordline (WL0) of the memory array, where the first wordline is associated with memory cells that are adjacent to one or more select gate (SG) transistors of the memory array (discussed with reference to FIG. 4), and the sequentially-ordered wordlines (e.g., WL2 . . . WLN) are numbered according to a distance away from the one or more SG transistors.

At operation 520, it is determined whether to program memory cells associated with the first wordline (WL0). More specifically, the processing logic determines whether to program the memory cells associated with the first wordline at some point after starting to program memory cells associated with other wordlines of the physical unit. In various embodiments, the timing of looping back to program the P2L mapping stored in the memory cells associated with the first wordline is scheduled or random. If scheduled, the P2L mapping data structure is programmed or updated at a regular interval (such as after programming memory cells associated with every four, six, ten, or the like WLs) while programming the rest of physical unit.

At operation 530, programing continues. More specifically, the processing logic causes memory cells associated with a sequentially-ordered next wordline of the physical unit of the memory array to be programmed in response to the answer to operation 520 being negative (or no). The method 500 then loops back to operation 520 and continues to determine whether it is time to program the memory cells associated with the first wordline.

At operation 540, memory cells associated with the first wordline (WL0) are programmed. More specifically, in response to determining that the memory cells associated with the first wordline are to be programmed (at operation 520), the processing logic causes P2L mapping metadata to be programmed to the memory cells associated with the first wordline. In some embodiments, the P2L mapping metadata is a P2L mapping data structure or table.

At operation 550, it is determined whether the physical unit is full. More specifically, the processing logic determines whether programming the physical unit of the memory array is complete, e.g., such that there are no more pages of memory cells available for programming. If the answer to operation 550 is no, then the method 500 loops back to operation 530, e.g., continuing with programming the remainder of the physical unit that remains available. If the answer to operation 550 is yes, then the method 500 terminates by ending programming of the physical unit.

In at least some embodiments of method 500, while programming the physical unit or after completion of programming the physical unit, the processing logic can optionally also compress metadata of the first wordline by programming the metadata into an extra page of the physical unit. Because the data is encoded within logical states of fewer memory cells (in multi-cell memory), the metadata is compressed within fewer memory cells. This is also called folding and can enable availability of a larger P2L mapping that might be required depending on the size of the physical unit (or sub-block) of memory.

In at least some embodiments, the operations of the method 500 further include causing the mapping (e.g., the mapping metadata in the P2L mapping data structure) to be erased upon causing the physical unit to be erased during a garbage collection (GC) operation. This may naturally happen if the entire block that includes the physical unit is erased due to the GC operation. But, because the data that was previously mapped is now erased, further updates to the corresponding P2L mapping metadata is unnecessary.

In at least some embodiments, the method 500 is extended to react to power loss events. For example, the processing logic can further detect a power loss of the memory device while causing the physical unit of the memory array to be programmed. The processing logic can further skip performing updates to the mapping upon power loss. The processing logic can further update the mapping in response to detecting a power up of the memory device. In some embodiments, the updating of the mapping can further (or also) be in response to detecting a closure of the physical block of memory that includes the physical unit.

Figure 6:
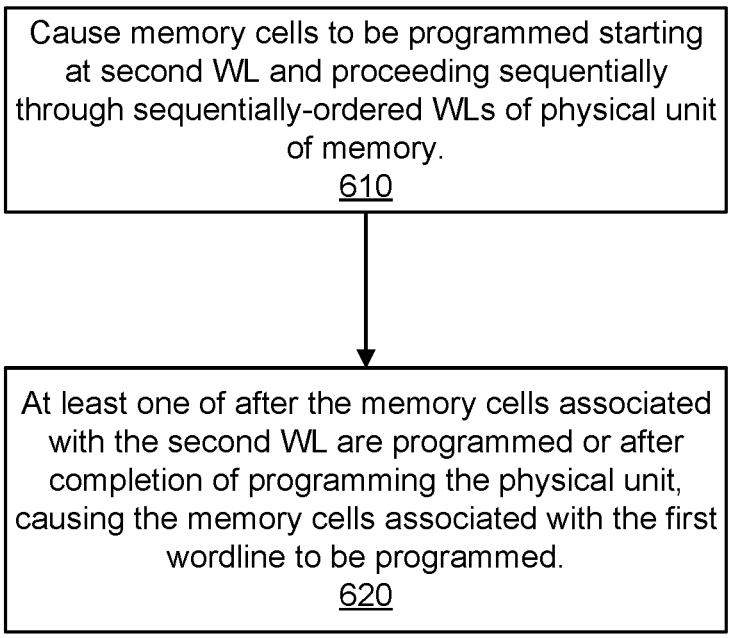
FIG. 6 is a flow diagram of an example method of out-of-order programming of memory cells associated with the first wordline of sequentially-ordered wordlines of a physical unit of memory in accordance with at least one embodiment.

FIG. 6 is a flow diagram of an example method 600 of out-of-order programming of memory cells associated with the first wordline of sequentially-ordered wordlines of a physical unit of memory in accordance with at least one embodiment. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, memory cells of a physical unit of a memory array are programmed. More specifically, the processing logic causes memory cells of a physical unit of the memory array to be programmed starting at a second wordline (WL1), which is adjacent to a first wordline (WL0) of the memory array, and proceeding sequentially through a plurality of sequentially-ordered wordlines of the physical unit. In these embodiments, the first wordline (WL0) is associated with memory cells that are adjacent to one or more select gate (SG) transistors of the memory array, and the sequentially-ordered wordlines are numbered according to a distance away from the one or more SG transistors.

At operation 620, the first wordline is programmed. More specifically, at least one of while the physical unit is being programmed, e.g., after the memory cells associated with the second wordline are programmed, or after completion of programming the physical unit, the processing logic causes the memory cells associated with the first wordline to be programmed.

Figure 7:
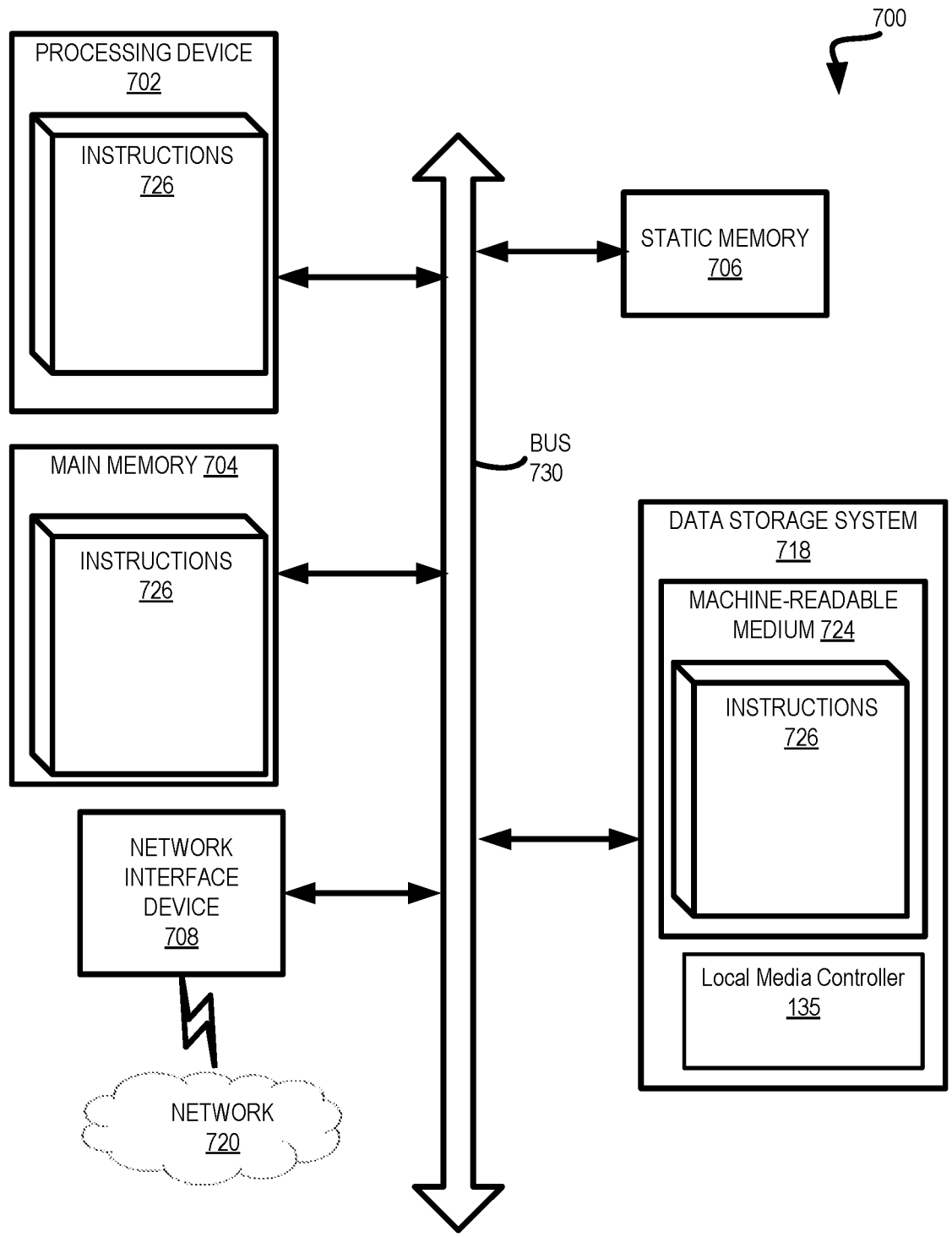
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 of FIGS. 1A-1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to the local media controller 135 of FIGS. 1A-1B). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
  a memory array comprising memory cells associated with a plurality of wordlines; and
  control logic operatively coupled to the memory array, the control logic to perform operations comprising:
    causing memory cells of a physical unit of the memory array to be programmed starting at a second wordline, which is adjacent to a first wordline of the memory array, and proceeding sequentially through a plurality of sequentially-ordered wordlines of the physical unit, wherein the plurality of sequentially-ordered wordlines comprises the first wordline and the second wordline and is a subset of the plurality of wordlines, and wherein the first wordline is associated with memory cells that are adjacent to one or more select gate (SG) transistors of the memory array, and the sequentially-ordered wordlines are numbered according to a distance away from the one or more SG transistors; and
    causing the memory cells associated with the first wordline to be programmed with metadata at a regular interval of a particular number of the plurality of sequentially-ordered wordlines having been programmed, wherein the memory cells associated with the first wordline are programmed at two or more of the regular intervals, and wherein the metadata is associated with programmed wordlines of the plurality of sequentially-ordered wordlines.

2. The memory device of claim 1, wherein the memory cells associated with the first wordline are configured as single-level cell memory.

3. The memory device of claim 2, wherein the operations further comprise compressing the metadata of the first wordline by programming the metadata into an extra page of the physical unit.

4. The memory device of claim 1, wherein all the memory cells, except for the memory cells associated with the first wordline, of the physical unit are configured as one of triple-level cell memory, multi-level cell memory, or quadruple-level cell memory.

5. The memory device of claim 1, wherein causing the memory cells associated with the first wordline to be programmed with the metadata comprises causing a mapping to be programmed to the memory cells associated with the first wordline, the mapping being of physical addresses to logical addresses of user data programmed to the physical unit.

6. The memory device of claim 5, wherein the metadata programmed to the first wordline is a physical-to-logical mapping data structure.

7. The memory device of claim 5, wherein the operations further comprise causing the mapping to be erased upon causing the physical unit to be erased during a media management operation.

8. The memory device of claim 5, wherein the operations further comprise:
  detecting a power loss of the memory device while causing the physical unit of the memory array to be programmed;
  skipping performing updates to the mapping upon power loss; and
  updating the mapping in response to detecting a power up of the memory device.

9. A method comprising:
  causing memory cells of a physical unit of a memory array to be programmed starting at a second wordline, which is adjacent to a first wordline of the memory array, and proceeding sequentially through a plurality of sequentially-ordered wordlines of the physical unit, wherein the first wordline is associated with memory cells that are adjacent to one or more select gate (SG) transistors of the memory array, and the sequentially-ordered wordlines are numbered according to a distance away from the one or more SG transistors; and
  causing the memory cells associated with the first wordline to be programmed with metadata at a regular interval of a particular number of the plurality of sequentially-ordered wordlines having been programmed, wherein the memory cells associated with the first wordline are programmed at two or more of the regular intervals, and wherein the metadata is associated with programmed wordlines of the plurality of sequentially-ordered wordlines.

10. The method of claim 9, wherein the memory cells associated with the first wordline are configured as single-level cell memory.

11. The method of claim 10, further comprising compressing the metadata of the first wordline by programming the metadata into an extra page of the physical unit.

12. The method of claim 9, wherein all the memory cells, except for the memory cells associated with the first wordline, of the physical unit are configured as one of triple-level cell memory, multi-level cell memory, or quadruple-level cell memory.

13. The method of claim 9, wherein causing the memory cells associated with the first wordline to be programmed with the metadata comprises causing a mapping to be programmed to the memory cells associated with the first wordline, the mapping being of physical addresses to logical addresses of user data programmed to the physical unit.

14. The method of claim 13, wherein the metadata programmed to the first wordline is a physical-to-logical mapping data structure.

15. The method of claim 13, further comprising causing the mapping to be erased upon causing the physical unit to be erased during a media management operation.

16. The method of claim 13, further comprising:
  detecting a power loss of a memory device, which includes the physical unit, while causing the physical unit of the memory array to be programmed;
  skipping performing updates to the mapping upon power loss; and
  updating the mapping in response to detecting a power up of the memory device and a closure of a physical block of memory that includes the physical unit.

17. A memory device comprising:
  a memory array arranged with physical blocks comprising physical sub-blocks of memory cells; and
  control logic operatively coupled to the memory array, the control logic to perform operations comprising:
    causing memory cells of a physical sub-block of the memory array to be programmed starting at a second wordline, which is adjacent to a first wordline of the memory array, and proceeding sequentially through a plurality of sequentially-ordered wordlines of the physical sub-block, wherein the first wordline is associated with memory cells that are adjacent to one or more select gate (SG) transistors of the memory array, and the sequentially-ordered wordlines are numbered according to a distance away from the one or more SG transistors; and
    causing metadata to be programmed to the memory cells associated with the first wordline at a regular interval of a particular number of the plurality of sequentially-ordered wordlines having been programmed, wherein the memory cells associated with the first wordline are programmed at two or more of the regular intervals, and wherein the metadata comprises a mapping of physical addresses to logical block addresses of user data that is programmed to the physical sub-block.

18. The memory device of claim 17, wherein the memory cells associated with the first wordline are configured as single-level cell memory and the memory cells associated with a remainder of the memory cells of the physical sub-block are configured as one of triple-level cell memory, multi-level cell memory, or quadruple-level cell memory.

19. The memory device of claim 17, wherein the operations further comprise causing the mapping to be erased upon causing the physical sub-block to be erased during a garbage collection operation.

20. The memory device of claim 17, wherein the operations further comprise:
  detecting a power loss of the memory device while causing the physical sub-block of the memory array to be programmed;
  skipping performing updates to the mapping upon power loss; and
  updating the mapping in response to detecting a power up of the memory device.

* * * * *